United States Patent [19]
Au et al.

[11] Patent Number: 5,774,011
[45] Date of Patent: Jun. 30, 1998

[54] ANTIFUSE CIRCUIT USING STANDARD MOSFET DEVICES

[75] Inventors: Wai-Ming William Au, Albuquerque, N. Mex.; Edward Joseph Nowak; Ming Ho Tong, both of Essex, Vt.

[73] Assignee: International Business Machines Corporation, Armonk, N.Y.

[21] Appl. No.: 864,254

[22] Filed: May 28, 1997

Related U.S. Application Data

[62] Division of Ser. No. 576,026, Dec. 21, 1995, Pat. No. 5,672,994.

[51] Int. Cl.$^6$ .................................................. H01H 37/76
[52] U.S. Cl. ................................................ 327/525
[58] Field of Search ............................................ 327/525

[56] References Cited

U.S. PATENT DOCUMENTS 5,019,878  5/1991  Yang et al. ............................ 357/23.3
5,293,133  3/1994  Birkner et al. .......................... 327/525
5,450,030  9/1995  Shin et al. ............................... 327/525
5,486,776  1/1996  Chiang .................................... 327/525
5,672,994  9/1997  Au et al. ................................. 327/525

*Primary Examiner*—Timothy P. Callahan
*Assistant Examiner*—Jeffrey Zweizig
*Attorney, Agent, or Firm*—Robert A. Walsh

[57] ABSTRACT

A programmable device is formed from a field-effect transistor. Specifically, the present invention generally related to integrated circuit (IC) structures and more particularly, to an improved antifuse structure for use in programming redundant and customizable IC chips. The anti-fuse is NFET made of MOS material and formed at a face of a semiconductor layer having an n-type doped source, and drain region, and a p-type doped channel region separating the source and drain regions. The device is programmed by applying a high voltage to the NFET drain to form a hot spot located along the channel width of the drain and thereby forming a bridge, which now has less resistance than the surrounding channel material, to the NFET source.

11 Claims, 2 Drawing Sheets

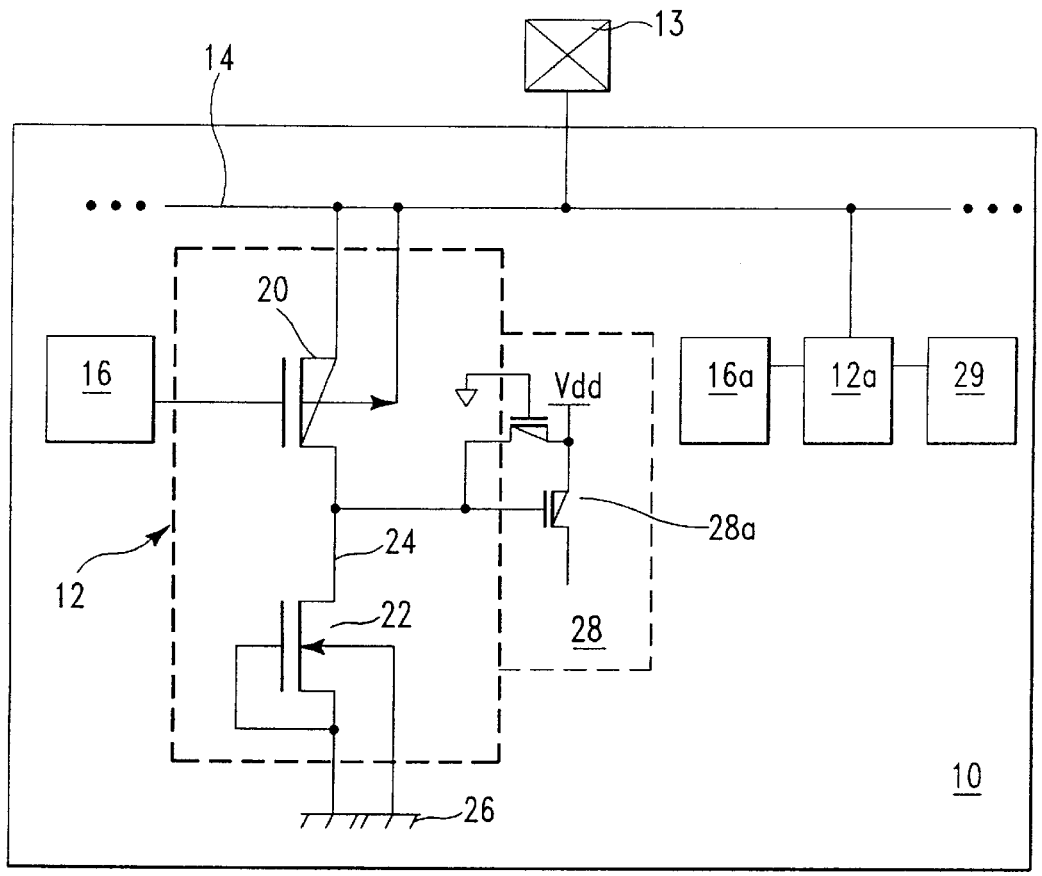
FIG. 1
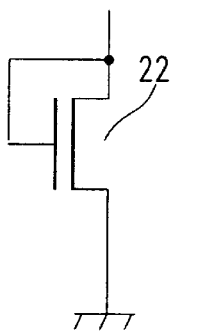
FIG. 2
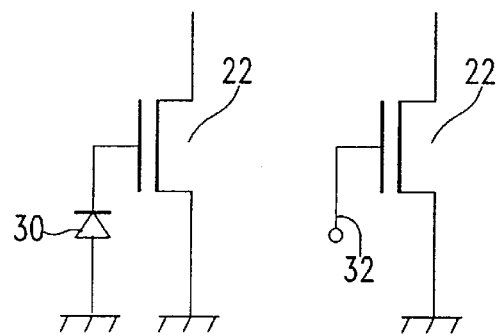
FIG. 3
FIG. 4
FIG. 5

ANTIFUSE CIRCUIT USING STANDARD MOSFET DEVICES

This is a division of application Ser. No. 08/576,026 filed Dec. 21, 1995 which application is now U.S. Pat. No. 5,672,994.

BACKGROUND OF THE INVENTION

1. Technical Field

The present invention generally related to integrated circuit (IC) structures and more particularly, to an improved antifuse structure for use in programming redundant elements of an IC chip or in customizing IC chips.

2. Background Art

In integrated circuit technology, there is often a need for supplying discretionary connections to discretionary circuits that, once established, are permanent. For example, discretionary connections are often used: 1) to program field programmable gate arrays (FPGAs), 2) to program read-only memories (ROMs), 3) for swapping redundant circuits or circuit elements for defective circuits or circuit elements, or 4) for providing user programmable features in ICs. For example, to repair a dysfunctional memory cell in a dynamic random access memory (DRAM) array, the defective array cells (i.e., one or more rows or columns of cells) are disabled, and a discretionary connection is selected and enabled to enable functional redundant array elements which will be addressed instead of the disabled array cells.

Often, discretionary connections are made with either "fusible" links or "antifusible" links. A fusible link, provides a closed connection when originally fabricated. The fusible link is then selectively blown to provide an open connection. The fusible link may be melted by applying an electric current through it; in other cases, a laser beam is used to melt the link.

However, the use of laser-blown fuses poses several problems. Often, the blowing of a fusible link does not result in an adequate disconnection. Dielectric layers, which are often deposited on top of the fusible elements and not uniformly thick from wafer to wafer, may cause the laser fuse flow to fail because different fuse elements receive different laser doses. Moreover, even if the fuse is blown, if a large enough gap is not created then the condition known as "healing" is likely to occur under conditions of high voltage and elevated temperatures, wherein by electromigration the two parts of the link re-establish an interconnection. This situation is particularly troublesome because initial circuit testing may indicate that the circuit is working properly, whereas over time (and in the field) the two parts of the link may re-fuse and the IC may become unreliable.

A typical antifusible link on the other hand, is made from a capacitor that provides an open connection when originally fabricated. The capacitor usually consists of two conductors or semiconductor materials having some kind of dielectric or insulating material between them. A silicon nitride dielectric layer interposed between two conductively-doped silicon conductors is one common type. During programming the capacitors plates are shorted to provide a closed connection, by applying a voltage across the dielectric layer that exceeds its breakdown voltage. A typical example of a capacitor antifuse can be found in U. S. Pat. No. 5,257,222, the teachings of which are herein incorporated by reference. Additionally, for an example of a fuse using a transistor, U.S. Pat. No. 5,019,878, teaches of a programmable interconnect or cell using silicided MOS transistors, the teachings of which are herein incorporated by reference.

As circuit integration has increased, I/O circuit fails have increased due to structural melt-downs caused by electrostatic discharge (ESD) shorting of the circuitry. In fact, ESD has been studied extensively, and is considered a major reliability threat to IC technologies. See Charvaka Duvvury, "ESD: A Pervasive Reliability Concern for IC Technologies," *Proceedings of the IEEE*, vol. 81, no.5, page 690–702, May 1993.

Many people have successfully designed around the ESD problem that causes ICs to short. Despite the presence of this commonly recurring problem in the industry, no one has taken advantage of the predictability of the shorts. Instead, this ESD problem has been uniformly viewed as an industry pariah.

SUMMARY OF THE INVENTION

One aspect of the invention comprises a programmable NFET device made of MOS material and formed at a face of a semiconductor layer having n-type doped source and drain regions, and a p-type doped channel region separating the source and drain regions. The device is programmed by applying a high voltage to the NFET drain to form a hot spot located along the channel width of the drain and thereby forming a bridge, which now has less resistance than the surrounding channel material, to the NFET source.

It is another aspect of the present invention to provide an integrated circuit having a programmable circuit, which uses only a standard NFET device as an anti-fuse, that allows a user to select discretionary or redundant circuitry.

The antifuse device of the invention has an advantage over conventional fuses and anti-fuses in that the element as programmed works with a resistance of only about one to ten kilo-ohms, as opposed to other anti-fuses which require much lower resistances.

Another aspect of the invention is that it takes only one hot spot to form a bridge across a channel length to achieve the desired resistance reduction to program the anti-fuse NFET.

Another advantage of the invention is that the antifuse can be programmed either at the wafer level using probes, or at the module level using input pins on the IC.

Another object of the invention is realized by a method of programming a one time programmable element in an integrated circuit. This is done by applying to a PFET device a first biasing voltage, where the PFET device is connected between a first voltage source and an NFET device. Additionally, a second biasing voltage may be applied to the PFET gate, which would connect the NFET device to the first voltage source and thus short the NFET device.

BRIEF DESCRIPTION OF DRAWINGS

The foregoing and other objects, features and advantages of the invention will be apparent from the following more particular description of preferred embodiments of the invention, as illustrated in the accompanying drawings. It is noted that like numbering in different figures represent like elements.

FIG. 1 is a schematic diagram of a circuit implementing the present invention.

FIG. 2 is a schematic diagram of a second embodiment of an anti-fuse for the circuit in FIG. 1.

FIG. 3 is a schematic diagram of a third embodiment of an anti-fuse for the circuit in FIG. 1.

FIG. 4 is a schematic diagram of a fourth embodiment of an anti-fuse for the circuit in FIG. 1.

FIG. 5 is a schematic diagram of a fifth embodiment of an anti-fuse for the circuit in FIG. 1.

DETAILED DESCRIPTION OF THE BEST MODE FOR CARRYING OUT THE INVENTION

Figure 6:
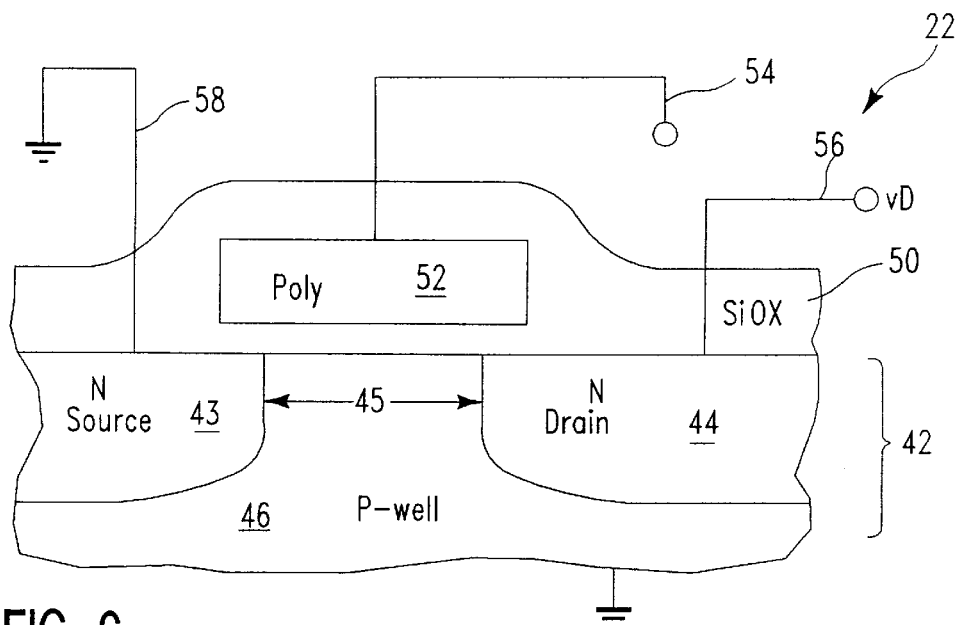
FIG. 6 is a cross sectional view of the anti-fuse in FIG. 1.

With reference to FIG. 1, an antifuse circuit 12 is shown that allows a user to programmably select discretionary circuitry 28. Specifically, there is an integrated circuit 10, or IC, having an antifuse circuit 12. To program the antifuse circuit 12, a high voltage needs to be applied for a selected period to node 14. One way of applying a high voltage to node 14 is by coupling it to the input/output pad 13, thus achieving module-level programming of the IC. Thereafter, if control circuitry 16 has been programmed by the user to turn on or close PFET 20, then the high voltage can be applied directly to the drain (node 24) NFET 22. NFET 22 is a standard diode-coupled MOS-NFET device and in this situation acts as an antifuse. Specifically, by applying an overloading voltage to the drain of NFET 22, the device breaks down, and in effect "blows" the antifuse. This operation is described in more detail below. Once NFET 22 is permanently "blown," it acts as a closed circuit creating a direct connection from node 24 to ground 26. With node 24 permanently grounded, discretionary circuit 28 will be permanently coupled to the supply voltage Vdd because PFET 28a is always on, thus being activated for operation.

It is pointed out that when a particular discretionary circuit is not needed, for example discretionary circuit 29, control circuitry 16a will keep the associated PFET, located in the antifuse circuit 12a, open during the application of the high voltage on node 14. Thus, the PFET will prevent the high voltage from being applied to the antifuse NFET within antifuse circuit 12a and thus not activate the associated discretionary circuitry 29.

It is further pointed out that by having many antifuse circuits coupled to node 14 a user is capable of programming many discretionary circuits at once. Additionally, this invention anticipates using many types and varieties of discretionary circuits on a single integrated circuit, for example a redundant memory cell or sense amp. One skilled in the art will easily understand from the foregoing description and the following figures that there are other methods to activate the discretionary circuit using variations of the illustrated circuitry. Specifically, in reference to FIG. 2, there is shown a second embodiment of NFET 22. In this example, the gate could be tied to the source of NFET 22. In reference to FIG. 3, there is shown a third embodiment where the gate of NFET 22 is coupled to ground through a diode 30. FIG. 4 illustrates that the gate of NFET 22 could be coupled to a floating node 32. Finally, FIG. 5 illustrates that it is contemplated to have the gate of NFET 22 coupled to a second control circuit that can be either on or off the integrated circuit 10.

In reference to FIG. 6, there is illustrated a cross-section of a typical NFET 22. As shown, there is a substrate 42 tied to ground, two N (negatively) doped regions creating the source 43 and drain 44, and a P (positively) doped region forming a P-well 46. A channel region 45, in the P-well region 46, typically separates the source 43 and drain 44 regions. A layer of silicon dioxide 50 covers the substrate, and typically has a polysilicon gate 52 (poly) imbedded therein. It is normal to have metal lines 54, 56 and 58 connected respectively to the gate, drain, and source of the NFET 22 to control the operation of the device, where Vg is the voltage applied to the gate 52, and Vd is the voltage applied to the drain 44 via. node 24.

Figure 7:
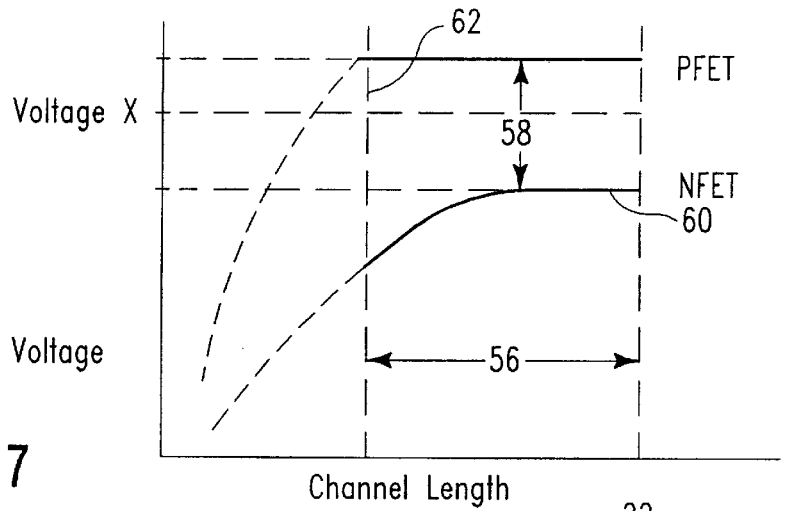
FIG. 7 is a standard characterization of breakdown voltage vs. channel length relationship for both a PFET and NFET device.

In reference to FIG. 7, there is illustrated a graph showing the approximate source-drain breakdown voltage versus channel length characteristic curves for both an NFET and PFET device as illustrated in FIG. 1. In general, as the FET channel length increases between the source and drain more voltage is required between the source and drain to cause a voltage breakdown in the device. Generally, it is understood that a voltage breakdown is caused by either a punch through and/or avalanche breakdown. NFET 60 and PFET 62 curves represent the gate-to-source maximum voltage that can be applied to the devices before they will break down. Graph section 56 illustrates an approximation of a relative device breakdown dependence on channel lengths used in current manufacturing processes between PFET and NFET. Voltage gap 58 shows the differences between the NFET and PFET voltage breakdown curves. Voltage X is an applied voltage to the circuit in FIG. 1 that would cause a voltage breakdown in the NFET 22 but not in the PFET 20. In practice the upper value of the PFET voltage is 9V and for the NFET is 6.5V, such that Vx is 7.5V.

Figure 8:
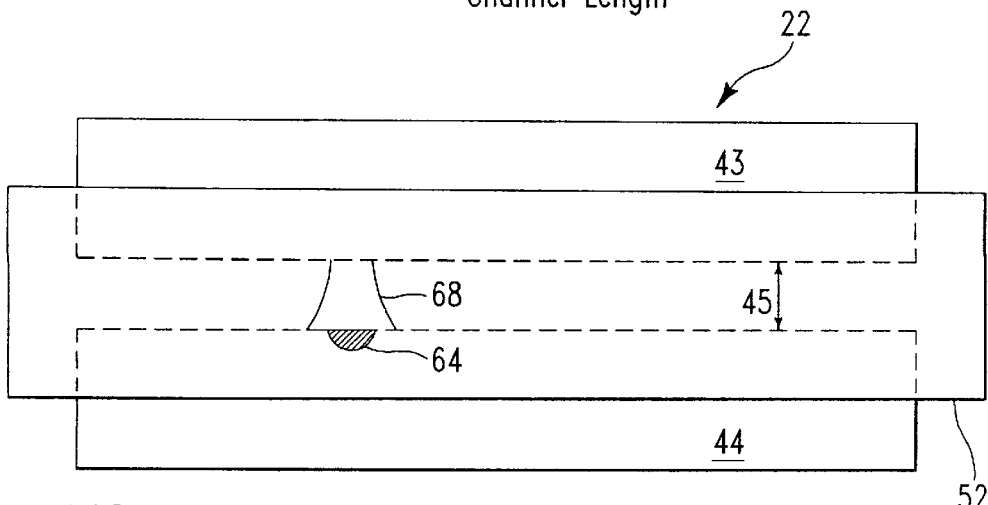
FIG. 8 is a plan view of the NFET anti-fuse in FIG. 1.

With reference to FIG. 8, a plan view of NFET 22 is shown. In operation, voltage breakdown of the NFET 22 device begins when the drain 44 undergoes an avalanche breakdown of a magnitude and duration sufficient to generate thermal heating at a localized hot spot 64. It is understood in electrostatic discharge technology, as applied to silicides, that there will always be a localized hot spot 64 in every device located somewhere along the width of the drain 44 abutting the channel 45. Once a localized hot spot is established, the generated heat enables sufficient outdiffusion of the dopant from the drain 44 to form a bridge 68 of n-type dopant to extend from the drain 44, through the channel 45, to the source electrode 43. As a result, the bridge 68 has either formed a region having a decreased electronic barrier to the source to drain conduction, or has increased the N-type dopant density in that portion of the channel 45. It is also noted that bridge 68 may be formed by melting of the silicon in the channel if the right parameters exist.

It has been experimentally established that the operation of the antifuse circuit will function if the resistance of bridge 68 has been lowered to about ten kilo-ohms. More specifically, for an NFET 22 having a channel width of 10 µm channel length of 0.5 µm, the gate and source at ground, and an applied drain voltage of 6.5V, the resulting channel resistance was on the order of a few hundred ohms. With this range of channel resistance, with Vdd=5V and Vg=Vs=OV there is enough leakage through the NFET 22 to permanently activate the discretionary circuit 28. Therefore, the NFET 22 has provided anti-fuse operation advantages by being "shorted out", or "blown." It is noted that by using better detection circuits higher resistances in the bridge will work, eg. in the range of 10k to 100k ohms.

It is additionally noted that by using the unbiased, or zero voltage, instead of a biased gate device, NFET designs illustrated in FIGS. 1, 3, 4, and 5, circuit designers can use smaller channel width PFETs to switch the high voltage from node 14 to 24. This provides the added advantage of allowing for denser integrated circuit designs.

It is further noted that the use of an NFET anti-fuse allows IC manufacturers to program the antifuse at the wafer level. To blow discrete devices at the wafer level is generally achieved by using testers with probes being attached to discrete locations on the chip.

It is also contemplated for the invention to be applied to the new technology referred to as silicon on insulator as described in the following publications: 1) "CMOS Scaling in the 0.1-μm, 1. x-volt Regime for High Performance Applications", IBM Journal of Research and Development, Vol. 39, No. ½ Jan./Mar. 1995, pp. 229–244, G. Shahidi et al. 2) "A Room Temperature 0.1 μm CMOS on SOI", IEEE Transactions on Electron Devices, Vol 41, No. 12, December 1994, pp 2405–2412, G. Shahidi et al. 3) "Silicon-on-Insulator Technology: materials to VLSA" Jean-Pierre Colinge, Kluwer Academic Publishers, Boston, 1991.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An integrated circuit having an antifuse circuit for enabling a discretionary circuit, comprising:
   a) a first node having a programmable high voltage applied thereto;
   b) a PFET having:
      a gate,
      a source coupled to the first node, and
      a drain coupled to a second node and the discretionary circuit;
   c) a programmable circuit, coupled to the gate of the PFET, for pulling the PFET gate voltage high and low; and
   d) an NFET having a drain electrode coupled to the second node, the NFET gate having a channel region with a predetermined width and length that is shorted upon application of the programmable high voltage.

2. The integrated circuit of claim 1 further comprising:
   an integrated circuit input pad, coupled to the first node, for applying the programmable high voltage to the first node.

3. The integrated circuit of claim 1 wherein the NFET is shorted by the programmable high voltage creating a hot spot in the NFET channel region.

4. The integrated circuit of claim 1 wherein the source of the NFET is coupled to the gate.

5. The integrated circuit of claim 1 wherein the gate of the NFET is coupled through a diode to ground.

6. The integrated circuit of claim 1 wherein the gate of the NFET is coupled to a floating node.

7. The integrated circuit of claim 1 wherein the gate of the NFET is coupled to a second control circuit.

8. The integrated circuit of claim 1 wherein the gate of the NFET is coupled to ground.

9. The integrated circuit of claim 3 wherein the high voltage is between 6 to 9 volts.

10. The integrated circuit of claim 3 wherein the high voltage is about 6.5 volts.

11. The integrated circuit of claim 10 wherein the NFET channel width is about 10 μm and channel length is about 0.5 μm.

* * * * *